United States Patent
Park et al.

(10) Patent No.: US 12,368,134 B2
(45) Date of Patent: *Jul. 22, 2025

(54) SEMICONDUCTOR PACKAGES INCLUDING DAM PATTERNS AND METHODS FOR MANUFACTURING THE SAME

(71) Applicant: SK hynix Inc., Icheon-si (KR)

(72) Inventors: Shin Young Park, Icheon-si (KR); Dong Hyun Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/323,239

(22) Filed: May 24, 2023

(65) Prior Publication Data
US 2023/0299047 A1 Sep. 21, 2023

Related U.S. Application Data

(63) Continuation of application No. 17/203,555, filed on Mar. 16, 2021, now Pat. No. 11,699,680.

(30) Foreign Application Priority Data

Jul. 30, 2020 (KR) ........................ 10-2020-0095470

(51) Int. Cl.
| | |
|---|---|
| *H01L 25/065* | (2023.01) |
| *H01L 21/56* | (2006.01) |
| *H01L 23/13* | (2006.01) |
| *H01L 23/31* | (2006.01) |

(52) U.S. Cl.
CPC ........ *H01L 25/0655* (2013.01); *H01L 21/565* (2013.01); *H01L 23/13* (2013.01); *H01L 23/31* (2013.01)

(58) Field of Classification Search
None
See application file for complete search history.

(56) References Cited

U.S. PATENT DOCUMENTS

| | | | |
|---|---|---|---|
| 6,013,946 A | 1/2000 | Lee et al. | |
| 6,210,992 B1 * | 4/2001 | Tandy .................. | H01L 21/565 438/126 |
| 9,024,448 B2 | 5/2015 | Jang et al. | |
| 11,699,680 B2 * | 7/2023 | Park ........................ | H01L 23/13 257/773 |
| 2017/0136669 A1 * | 5/2017 | Choi ..................... | H01L 21/565 |

* cited by examiner

*Primary Examiner* — Long Pham
(74) *Attorney, Agent, or Firm* — WILLIAM PARK & ASSOCIATES LTD.

(57) ABSTRACT

Disclosed are a semiconductor package and a manufacturing method thereof. Semiconductor chips may be disposed on a package substrate with vent holes formed therethrough, and a molding layer including a lower molding portion connected to an upper molding portion may be formed. The package substrate may include a substrate body with a plurality of unit regions, ball lands disposed in the unit regions, and first and second dam patterns that cross the unit regions and extend into edge regions, which is outside of the unit regions.

17 Claims, 20 Drawing Sheets

SEMICONDUCTOR PACKAGES INCLUDING DAM PATTERNS AND METHODS FOR MANUFACTURING THE SAME

CROSS-REFERENCE TO RELATED APPLICATIONS

The present application is a continuation application of U.S. patent application Ser. No. 17/203,555, filed on Mar. 16, 2021, and claims priority under 35 U.S.C. 119(a) to Korean Application No. 10-2020-0095470, filed on Jul. 30, 2020, which is incorporated herein by reference in its entirety.

BACKGROUND

1. Technical Field

The present disclosure generally relates to a packaging technology and, more particularly, to semiconductor packages including dam patterns and methods for manufacturing the same.

2. Related Art

A semiconductor package may include a semiconductor chip disposed on a package substrate, and a molding layer. The molding layer may be molded as a layer that protects the semiconductor chip from external stress. During a molding process, a mold flash phenomenon may occur in which a molding material leaks out of a mold cavity. The leaked molding material may contaminate elements of the package substrate.

SUMMARY

An aspect of the present disclosure may provide a semiconductor package including a package substrate with vent holes formed therethrough, semiconductor chips disposed on the package substrate, and a molding layer including an upper molding portion that encapsulates the semiconductor chips and a lower molding portion that is connected to the upper molding portion through the vent holes. The package substrate may include a substrate body including a plurality of unit regions with the vent holes disposed therethrough, ball lands disposed in each of the unit regions of the substrate body, and first and second dam patterns that are spaced apart from the ball lands of the substrate body, extending across the unit regions and further extending into edge regions of the substrate body, which is outside of the unit regions.

An aspect of the present disclosure may provide a semiconductor package including a package substrate with vent holes formed therethrough, semiconductor chips disposed on the package substrate, and a molding layer including an upper molding portion that encapsulates the semiconductor chips, and a lower molding portion that is connected to the upper molding portion through the vent holes, wherein the package substrate may include a substrate body including first and second edges that are on opposite sides of each other and a surface between the first and second edges, ball lands disposed on the surface of the substrate body, and first and second dam patterns spaced apart from the ball lands, extending to the first and second edges across the surface.

An aspect of the present disclosure may provide a method of manufacturing a semiconductor package including: disposing semiconductor chips on a package substrate with vent holes therethrough, the package substrate including a substrate body with a plurality of unit regions, ball lands disposed in the unit regions of the substrate body, first and second dam patterns that are spaced apart from the ball lands of the substrate body, extends across the unit regions, and further extends into an edge region of the substrate body outside the unit regions, and a dielectric layer extending to cover the substrate to cover the first and second dam patterns and to open some portions of the ball lands; loading the package substrate in a mold chase, including an upper mold that provides an upper cavity in which the semiconductor chips are to be located and a lower mold that provides a lower cavity to which the vent holes are connected; and molding a molding layer into an upper molding portion by filling the upper cavity and a lower molding portion by filling the lower cavity while being connected to the upper molding portion through the vent holes, wherein the lower mold includes sides of lower mold with an upper end overlapping with the first and second dam patterns of the package substrate and contacting a surface of the dielectric layer to close the lower cavity.

DETAILED DESCRIPTION

Figure 1:
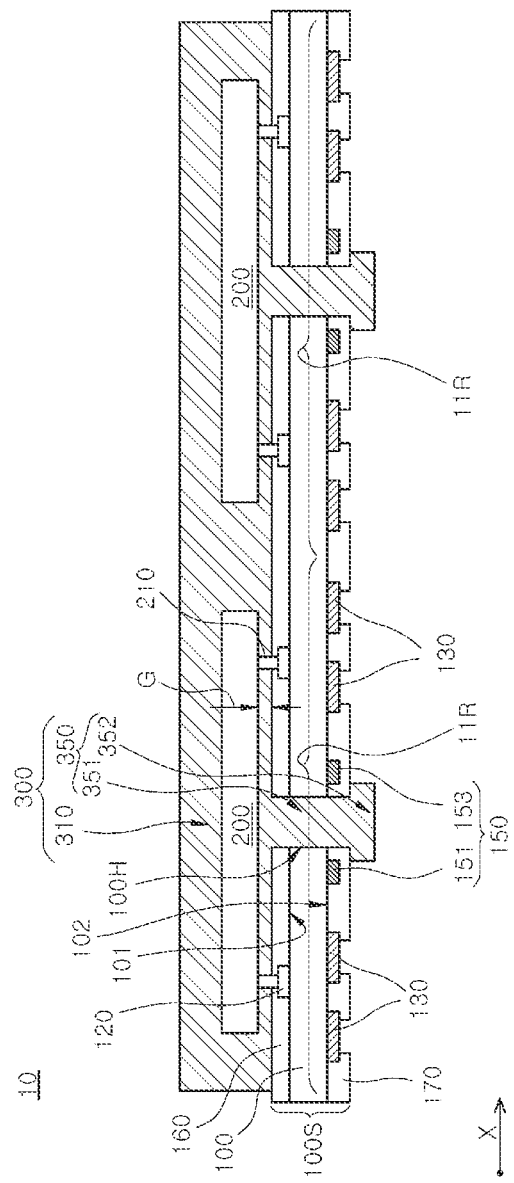
FIGS. 1 and 2 are schematic cross-sectional views illustrating a semiconductor package according to an embodiment of the present disclosure.

The terms used herein may correspond to words selected in consideration of their functions in presented embodiments, and the meanings of the terms may be construed to be different according to those of ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

In the description of the embodiments of the present disclosure, descriptions such as "first" and "second," "upper" and "lower," and "left" and "right" are for distinguishing members, and are not used to limit the members themselves or to mean a specific order.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The semiconductor device may include a semiconductor substrate or a structure in which a plurality of semiconductor substrates are stacked. The semiconductor device may indicate a semiconductor package structure in which a structure in which semiconductor substrates are stacked is packaged. The semiconductor substrate may indicate a semiconductor wafer, a semiconductor die, or a semiconductor chip in which electronic components and devices are integrated. The semiconductor chip may indicate memory chips in which memory integrated circuits such as dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) are integrated, logic dies or ASIC chips in which logic circuits are integrated in a semiconductor substrate, or processor such as application processors (Aps), graphic processing units (GPUs), central processing units (CPUs) or system-on-chips (SoCs). The semiconductor devices may be employed in information communication systems such as mobile phones, electronic systems associated with biotechnology or health care, or wearable electronic systems. The semiconductor packages may be applicable to internet of things (IoT).

Same reference numerals refer to the same devices throughout the specification. Even though a reference numeral might not be mentioned or described with reference to a drawing, the reference numeral may be mentioned or described with reference to another drawing. In addition, even though a reference numeral might not be shown in a drawing, it may be shown in another drawing.

Figure 2:
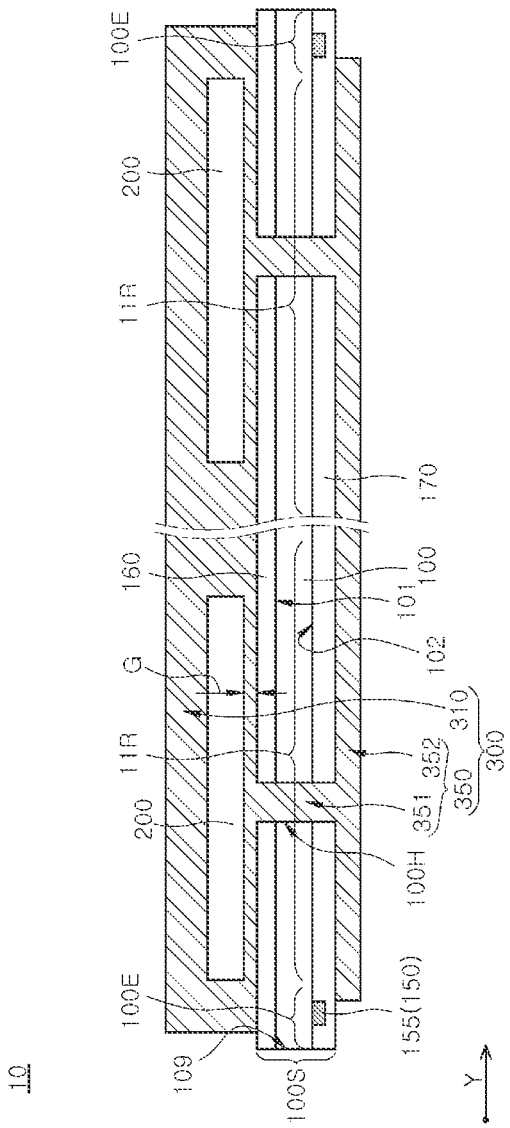

FIGS. 1 and 2 are schematic cross-sectional views illustrating a semiconductor package 10 according to an embodiment of the present disclosure. FIG. 1 illustrates a schematic cross-sectional shape of the semiconductor package 10 along the X-axis, and FIG. 2 illustrates a schematic cross-sectional shape of the semiconductor package 10 along the Y-axis. In the X-Y plane, the X-axis direction may be a direction in which an extended portion 352 of a lower molding portion 350 of the semiconductor package 10 extends long, and the Y-axis direction may be a direction orthogonal to the X-axis direction.

Referring FIGS. 1 and 2, the semiconductor package 10 may include a package substrate 100S, semiconductor chips 200, and a molding layer 300. Each of the semiconductor chips 200 may be a semiconductor chip in which integrated circuits are integrated. The semiconductor chips 200 may be disposed on the package substrate 100S in a flip-chip method. The semiconductor chips 200 may be electrically and physically connected to the package substrate 100S by inner connectors 210. The inner connectors 210 may include conductive bumps.

The molding layer 300 may include a molding material encapsulating the semiconductor chips 200. The molding layer 300 may include an epoxy molding compound (EMC). The molding layer 300 may be molded by a molding process by using a mold chase. The molding layer 300 may be extended to fill a gap G between each of the semiconductor chips 200 and the package substrate 100S while covering and protecting the semiconductor chips 200. The molding layer 300 may be disposed in a form of a molded underfill (MUF).

The package substrate 100S may be an interconnection element for electrically connect the semiconductor chips 200 to an external device. The package substrate 100S may be a member with circuit traces for electrical connection. The package substrate 100S may include a structure of a printed circuit board (PCB).

The package substrate 100S may include vent holes 100H therethrough. The vent holes 100H may be disposed at positions that overlap with the semiconductor chips 200. The vent holes 100H may be introduced to substantially reduce, suppress, or prevent the occurrence of a filling defect in which the gap G between each of the semiconductor chips 200 and the package substrate 100S is not filled with a molding material in a molded underfill (MUF) molding process for forming the molding layer 300. The MUF molding process may be performed so that the molding material is introduced into the vent holes 100H. The molding material may pass through the gap G between each of the semiconductor chips 200 and the package substrate 100S and flow into the vent holes 100H. The flow of the molding material may substantially reduce or suppress undesired stagnation of the molding material in the gap G between each of the semiconductor chips 200 and the package substrate 100S. Accordingly, a phenomenon in which voids are trapped in the gap G between each of the semiconductor chips 200 and the package substrate 100S may be substantially reduced, suppressed, or prevented.

By such a molded underfill molding process, the molding layer 300 may be formed in a structure with an upper molding portion 310 and a lower molding portion 350. The lower molding portion 350 may be connected to the upper molding portion 310 of the molding layer 300 through the vent holes 100H. The upper molding portion 310 may be formed as a portion of the molding layer 300 that is positioned on the package substrate 100S, and encapsulate the semiconductor chips 200. The lower molding portion 350 may include filling portions 351 and extended portions 352. The extended portions 352 of the lower molding portion 350 may include portions of the molding layer 300 that is positioned under the package substrate 100S. The filling portions 351 of the lower molding portion 350 may include portions of the molding layer 300 that fills the vent holes 100H.

The package substrate 100S may include a substrate body 100, a first dielectric layer 160 and a second dielectric layer 170 that are disposed on the substrate body 100. The substrate body 100 may have a first surface 101 and a second surface 102 that are on opposite sides of each other. The semiconductor chips 200 may be disposed over the first surface 101 of the substrate body 100.

Bonding fingers 120 may be disposed on the first surface 101 of the substrate body 100. The bonding fingers 120 may be portions of a circuit wiring structure to which the inner connectors 210 are connected. The bonding fingers 120 may be metal patterns or conductive patterns that are formed of or including a metal material, such as copper (Cu). The first dielectric layer 160 may be disposed to cover the first surface 101 of the substrate body 100 on which the bonding fingers 120 are disposed. The first dielectric layer 160 may be made of or include a solder resist (SR) material.

Ball lands 130 and dam patterns 150 may be disposed under the second surface 102 of the substrate body 100. Each of the dam patterns 150 may include a first dam pattern 151 and a second dam pattern 153 that face each other. As illustrated in FIG. 1, the first and second dam patterns 151 and 153 may be disposed on both sides of each of the vent holes 100H, interposed therebetween. As illustrated in FIG. 2, each of the dam patterns 150 may further include a third dam pattern 155 that is disposed in an edge region 100E of the substrate body 100.

The ball lands 130 may be connection terminals that electrically connect the semiconductor package 10 to an external device. The ball lands 130 may be connection terminals to which external connectors (not illustrated) are connected. The external connectors may include solder balls. The ball lands 130 may be portions of a circuit wiring structure configured in the package substrate 100S.

The ball lands 130, the first, second, and third dam patterns 151, 153, and 155 may be made or include substantially the same metal material. The ball lands 130, the first, second, and third dam patterns 151, 153, and 155 may be made or include a metal material such as copper (Cu). The ball lands 130, the first, second, and third dam patterns 151, 153, and 155 may be metal patterns or conductive patterns that are formed together in the same process. The first, second, and third dam patterns 151, 153, and 155 and the ball lands 130 may be formed to have substantially the same thickness, under the second surface 102 of the substrate body 100.

The second dielectric layer 170 may be disposed to open some portions of the ball lands 130 while covering the first, second, and third dam patterns 151, 153, and 155. The second dielectric layer 170 may be disposed as a layer that extends to cover the second surface 102 of the substrate body 100. The second dielectric layer 170 may be formed of or include a solder resist (SR) material.

Figure 3:
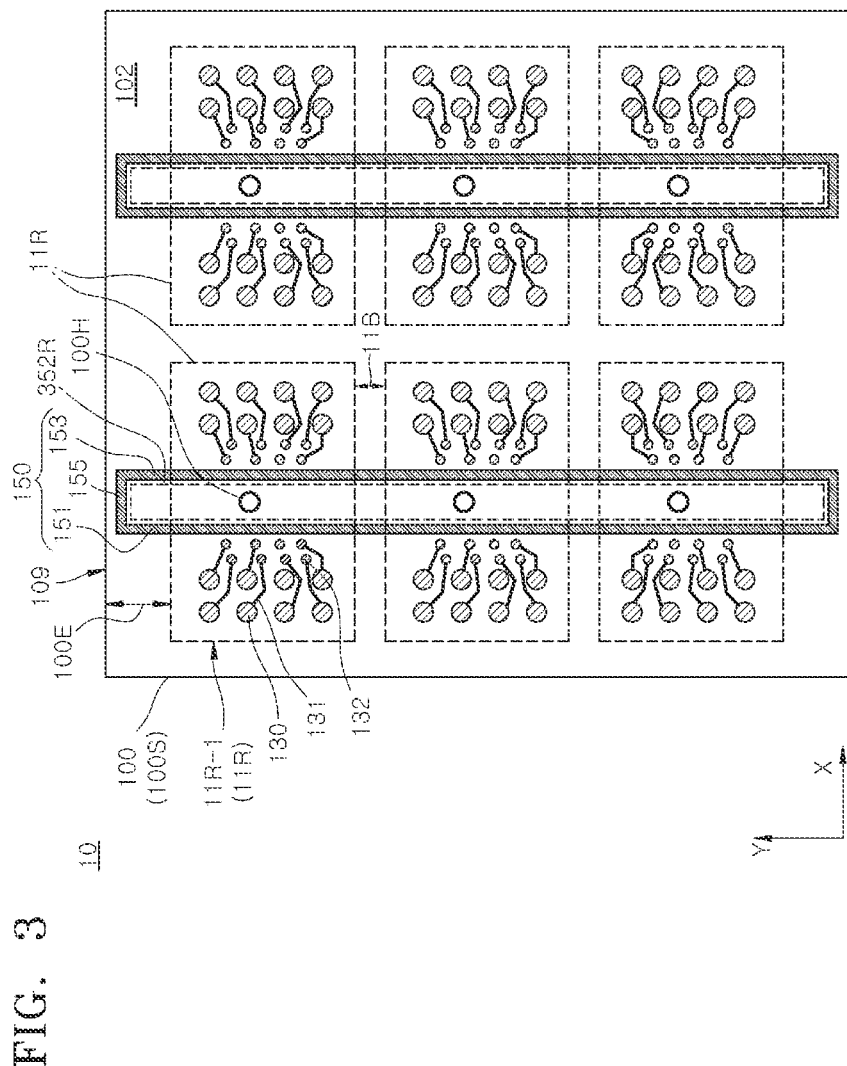
FIG. 3 is a schematic plan view illustrating a planar arrangement shape of dam patterns of the semiconductor package of FIG. 1.
Figure 4:
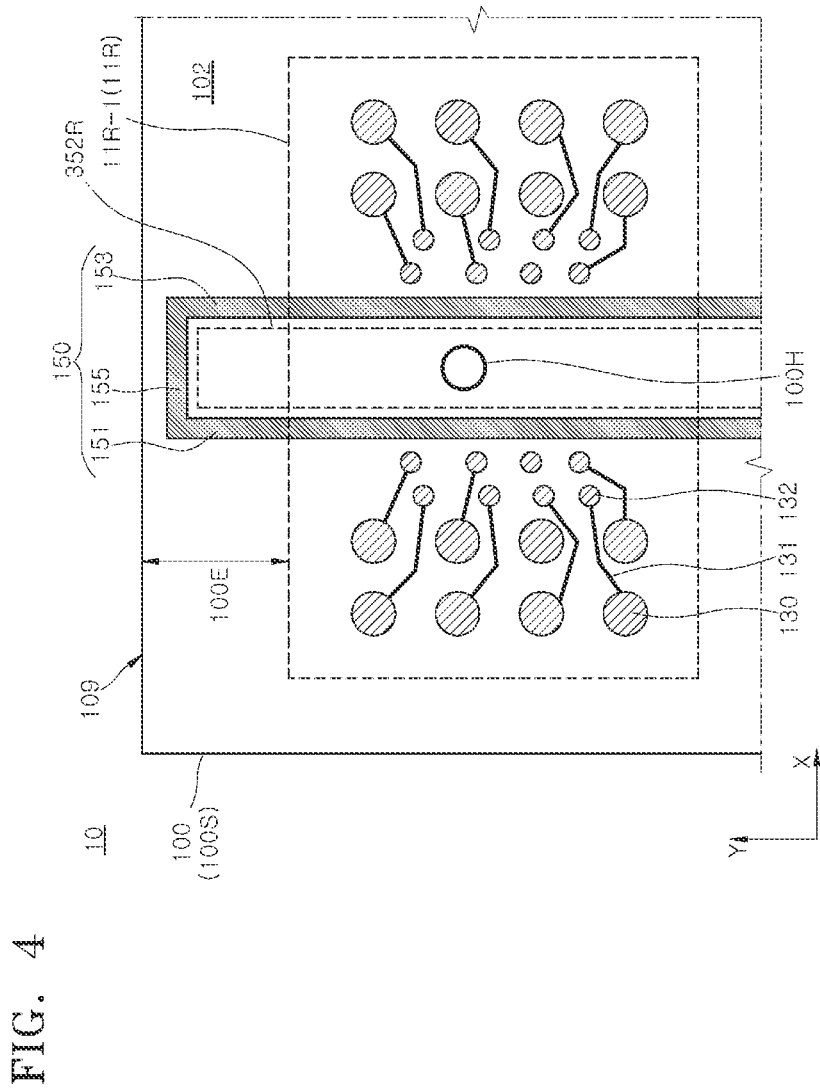
FIG. 4 is a schematic plan view illustrating an enlarged portion of the dam pattern of the semiconductor package of FIG. 3.

FIG. 3 is a schematic plan view illustrating a planar arrangement shape of the dam patterns 150 of the semiconductor package 10 of FIG. 1. FIG. 4 is a schematic plan view illustrating an enlarged portion of the dam pattern 150 of the semiconductor package 10 of FIG. 3.

Referring to FIGS. 3 and 4, the ball lands 130 may be disposed on the second surface 102 of the substrate body 100 of the package substrate 100S. The dam patterns 150 with the first and second dam patterns 151 and 153 may be disposed to be spaced apart from the ball lands 130. The first and second dam patterns 151 and 153 may be disposed to be electrically isolated from the ball lands 130 without being electrically connected to the ball lands 130. Because the first and second dam patterns 151 and 153 may be made of the same metal material as the ball lands 130, the first and second dam patterns 151 and 153 may be disposed while being spaced apart from the ball lands 130 so as to be electrically isolated from the ball lands 130.

The substrate body 100 may include a plurality of unit regions 11Rs. The plurality of unit regions 11Rs may be configured as regions that are positioned on the second surface 102 of the substrate body 100. The plurality of unit regions 11Rs may be disposed on the second surface 102 of the substrate body 100 to form a matrix-like structure with each other. The plurality of unit regions 11Rs may be disposed on the second surface 102 to form rows in the X-axis direction and columns in the Y-axis direction.

The ball lands 130 may be disposed as a group in the unit region 11R. All ball lands 130 that are disposed in one unit region 11R as a group may be electrically connected to one semiconductor chip (200 in FIG. 1). One semiconductor chip 200 may overlap with one unit region 11R of the substrate body 100, as shown in FIG. 1. Conductive connection patterns 131 and conductive vias 132 may be further disposed in the unit region 11R of the substrate body 100. The connection patterns 131 may be conductive patterns that electrically connect the ball lands 130 to the conductive vias 132. The conductive vias 132 may extend substantially through the substrate body 100 to be electrically connected to the bonding fingers 120 on the first surface (101 in FIG. 1) of the substrate body 100, respectively. The ball lands 130 may be electrically connected to the bonding fingers 120 by the conductive vias 132 and the connection patterns 131.

Each of the vent holes 100H may be disposed in each of the unit regions 11R of the substrate body 100. In an embodiment, the plurality of vent holes 100H may be disposed in one unit region 11R, but it may be more effective to arrange one vent hole 100H for each unit region 11R to implement a flow in which the molding material flows into the vent holes 100H.

The first and second dam patterns 151 and 153 may be disposed as linear patterns that extend while facing each other. Each of the vent holes 100H may be disposed between the first and second dam patterns 151 and 153.

The first and second dam patterns 151 and 153 may be linear patterns that extend to cross the plurality of unit regions 11R on the second surface 102 of the substrate body 100. The first and second dam patterns 151 and 153 may extend to cross some of the unit regions 11R that are arranged in columns among the unit regions 11R. The first and second dam patterns 151 and 153 may extend across an intermediate region 11B between two unit regions 11R that are adjacent to each other in the Y-axis direction.

The first and second dam patterns 151 and 153 may extend across the unit regions 11R and further extend into edge regions 100E of the substrate body 100 that is outside the unit regions 11R. The edge regions 100E of the substrate body 100 may be a region including an intermediate region between an outermost unit region 11R-1 that is positioned at the outermost of the unit regions 11R and an edge 109 of the substrate body 100.

Each of the dam patterns 150 may further include the third dam pattern 155. The third dam pattern 155 may connect end portions of the first and second dam patterns 151 and 153 to each other. The third dam patterns 155 may be disposed in the edge region 100E of the substrate body 100. Accordingly, the third dam patterns 155 may be positioned outside the unit regions 11R. The third dam patterns 155 may connect the first and second dam patterns to each other so that the dam patterns 150 may be disposed in a loop planar shape as shown in FIG. 3.

The first, second, and third dam patterns 151, 153, and 155 may extend along an extension region 352R where the extended portion (352 of FIG. 2) of the lower molding portion (350 of FIG. 2) will be located. Accordingly, the extension region 352R in which the extended portion (352 in FIG. 2) of the lower molding portion (350 in FIG. 2) will be located may be set inside the first, second, and third dam patterns 151, 153, and 155. The extension regions 352R may be set as regions that extend long in the Y-axis direction along the first and second dam patterns 151 and 153. The extension regions 352R may extend across the unit areas 11R and may further extend into the edge region 100E.

Figure 5:
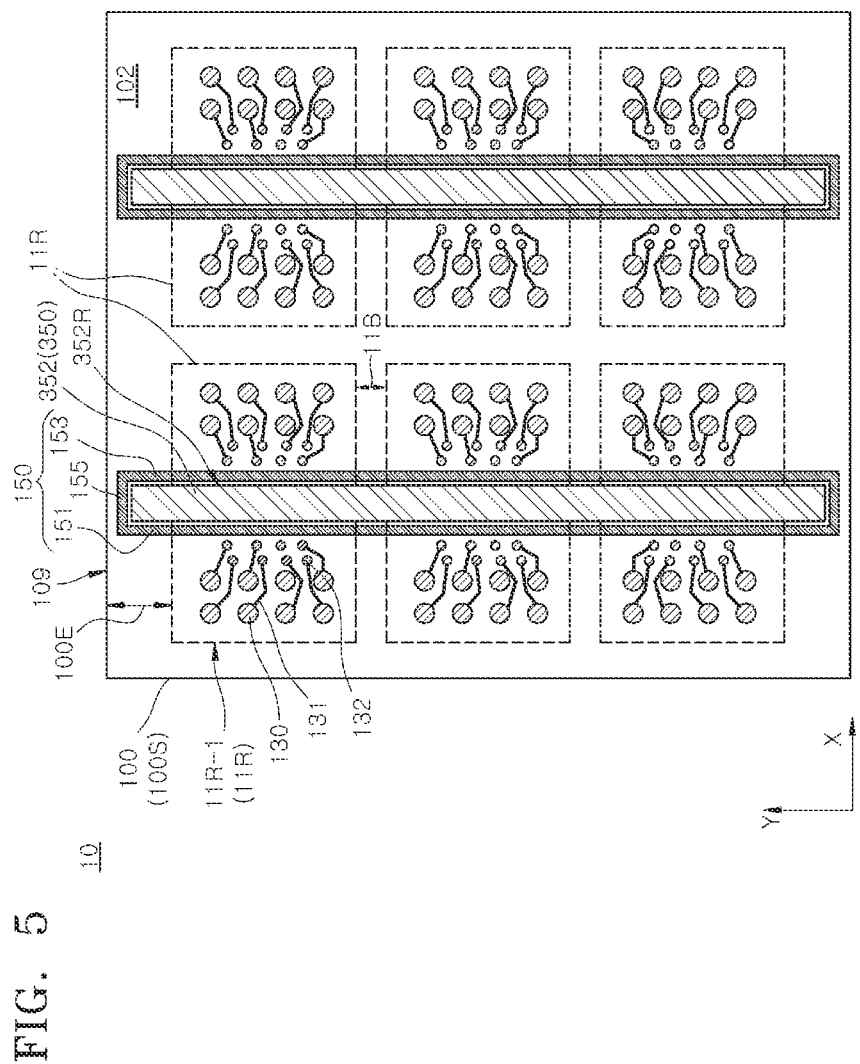
FIG. 5 is a schematic plan view illustrating a planar arrangement shape of extended portions of a lower molding portion of the semiconductor package of FIG. 1.
Figure 6:
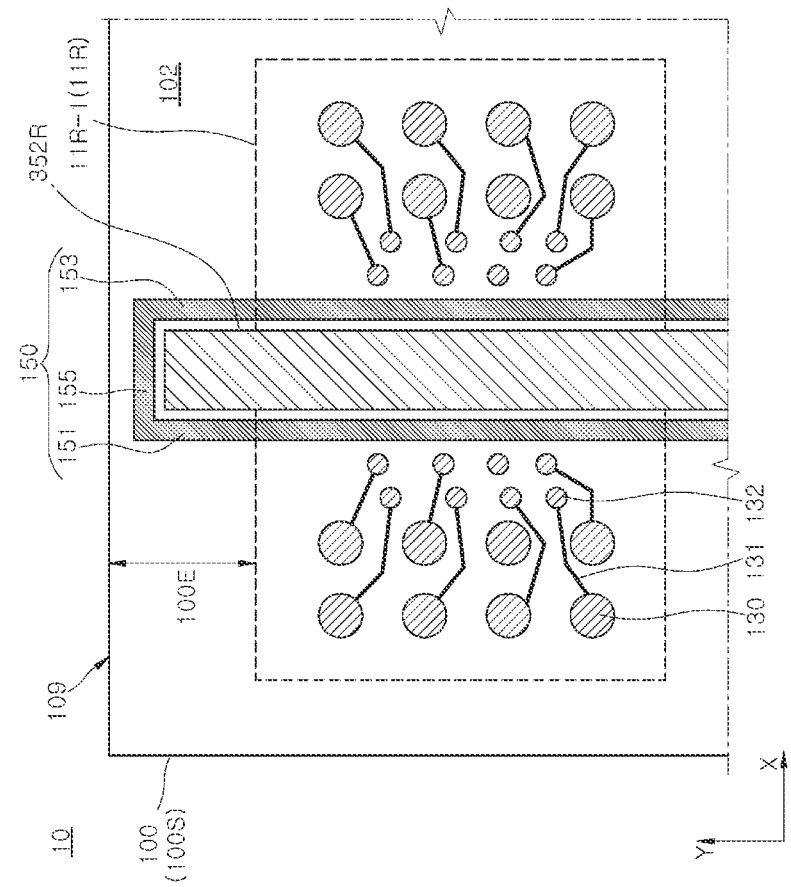
FIG. 6 is a schematic plan view illustrating an enlarged portion of the extended portion of the lower molding portion of the semiconductor package of FIG. 5.

FIG. 5 is a schematic plan view illustrating a planar arrangement shape of the extended portions 352 of the lower molding portion of the semiconductor package 10 of FIG. 1. FIG. 6 is a schematic plan view illustrating an enlarged portion of the extended portion 352 of the lower molding portion of the semiconductor package 10 of FIG. 5.

Referring to FIGS. 5 and 6, the extended portions 352 of the lower molding portion 350 may be disposed in the extension region 352R. Each of the extended portions 352 of the lower molding portion 350 may be located in an inner region of the first, second, and third dam patterns 151, 153, and 155. The extended portions 352 of the lower molding portion 350 may overlap with portions of the substrate body 100 between the first and second dam patterns 151 and 153. The extended portions 352 of the lower molding portion 350 may extend across the unit regions 11R and further extend into the edge regions 100E of the substrate body 100 that is outside the unit regions 11R. In an embodiment, the extended portions 352 of the lower molding portion 350 may be further extended to partially overlap with the first and second dam patterns 151 and 153.

Figure 7:
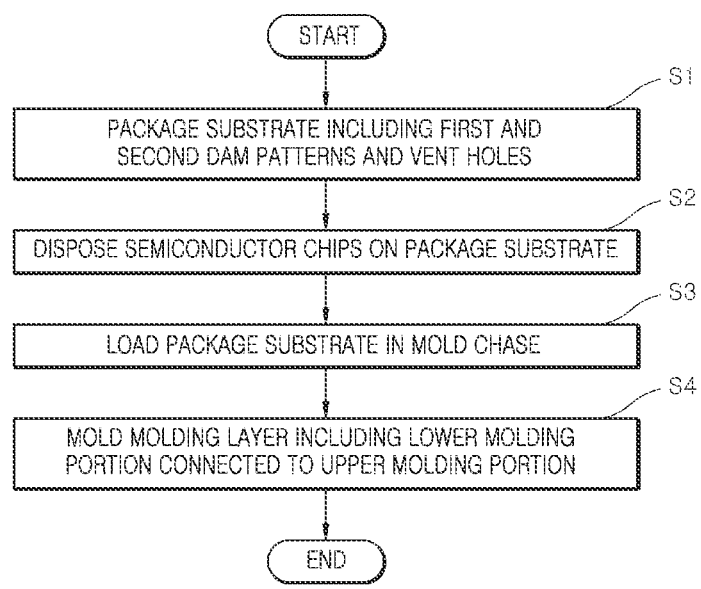
FIG. 7 is a schematic flowchart illustrating a method of manufacturing a semiconductor package according to an embodiment of the present disclosure.
Figure 8:
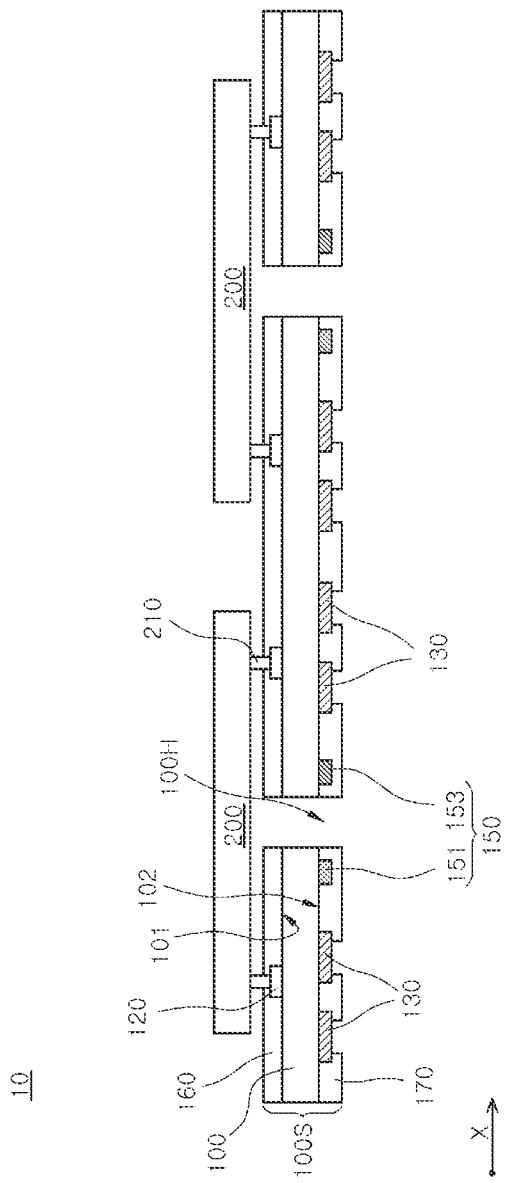
FIGS. 8 and 9 are schematic cross-sectional views illustrating a step of disposing semiconductor chips on a package substrate in the method of manufacturing the semiconductor package of FIG. 7.
Figure 9:
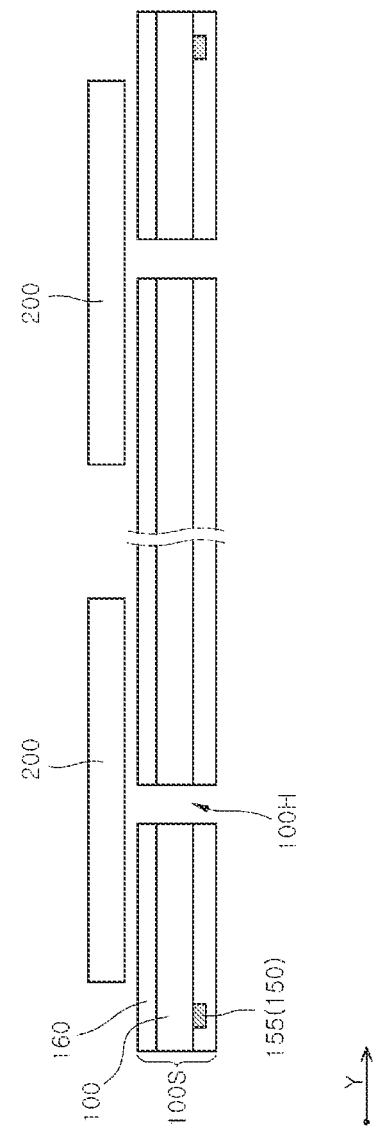

FIG. 7 is a schematic flowchart illustrating a method of manufacturing a semiconductor package according to an embodiment of the present disclosure. FIGS. 8 and 9 are schematic cross-sectional views illustrating a step S2 of arranging semiconductor chips 200 on a package substrate 100S in the method of manufacturing the semiconductor package of FIG. 7. FIG. 8 illustrates schematic cross-sectional shapes of the package substrate 100S and the semiconductor chips 200 along the X-axis direction, and FIG. 9 illustrates schematic cross-sectional shapes of the package substrate 100S and the semiconductor chips 200 along the Y-axis direction.

Referring to FIG. 7 and FIGS. 8 and 9, the package substrate 100S with first and second dam patterns 151 and 153 and vent holes 100H is illustrated. The package substrate 100S may further include third dam patterns 155. Semiconductor chips 200 may be disposed on the package substrate 100S (S2). The structure in which the semiconductor chips 200 may be disposed on the package substrate 100S may be a structure to be molded to which a molded underfill (MUF) molding process is to be applied.

Figure 10:
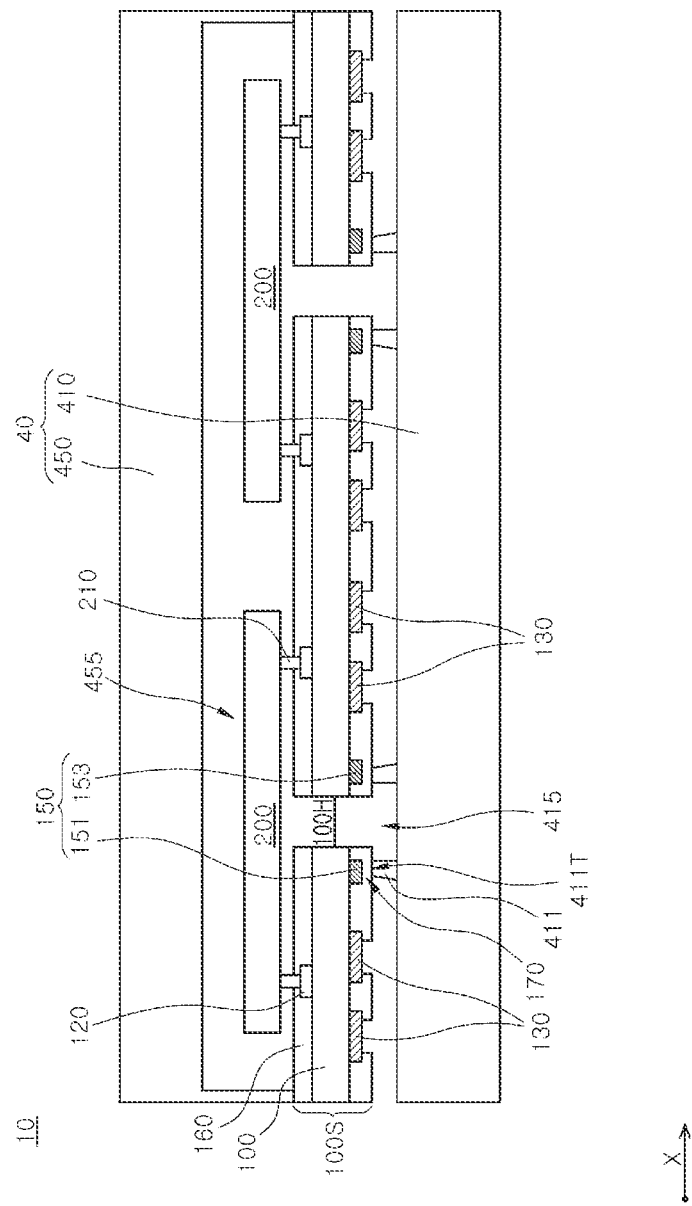
FIGS. 10 and 11 are schematic cross-sectional views illustrating a step of loading the package substrate of FIG. 7 into a mold chase device.
Figure 11:
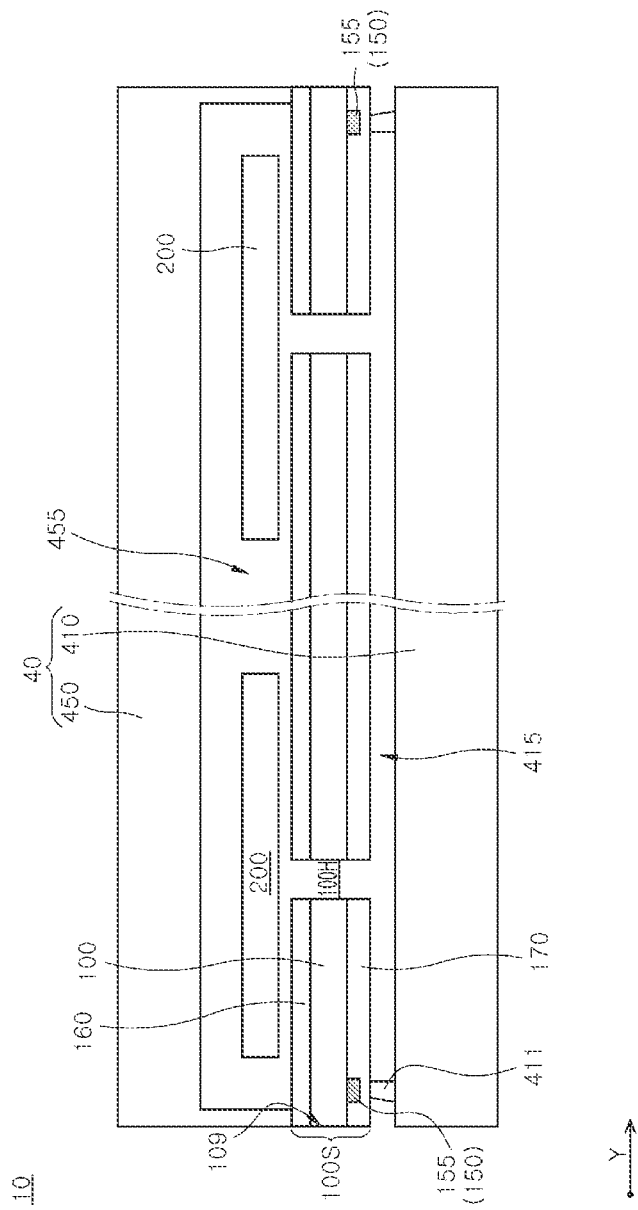

FIGS. 10 and 11 are schematic cross-sectional views illustrating a step S3 of loading the package substrate 100S of FIG. 7 into a mold chase 40.

Referring to FIG. 7 and FIGS. 10 and 11, the package substrate 100S on which the semiconductor chips 200 are disposed is loaded in the mold chase 40. The mold chase 40 may be a process device in which molded underfill (MUF) molding process is performed. The mold chase 40 may include an upper mold 450 and a lower mold 410.

The upper mold 450 may be a mold part that provides an upper cavity 455 into which the semiconductor chips 200 are inserted. The lower mold 410 may be a different mold part that corresponds to the upper mold 450. The lower mold 410 may be another mold part that provides a lower cavity 415. The lower mold 410 may include sides of lower mold 411. The sides of lower mold 411 may each have a tube shape that provides the lower cavity 415 as an inner space. The vent holes 100H may be connected to the lower cavity 415.

The package substrate 100S may be loaded in the cavities 415 and 455 of the mold chase 40. By closing the upper mold 450 and the lower mold 410, the cavities 415 and 455 therein may be sealed and isolated from the exterior. An upper end 411T of each of the sides of lower mold 411 may be in close contact with a surface of a second dielectric layer 170 of the package substrate 100S. In this way, the lower cavity 415 may be isolated from the exterior by closing the upper end 411T of each of the sides of lower mold 411 and the package substrate 100S. The upper end 411T of each of the sides of lower mold 411 may overlap with the first and second dam patterns 151 and 153, and contact the surface of the second dielectric layer 170. The upper end 411T of each of the sides of lower mold 411 may be further extended to contact the surface of the second dielectric layer 170 while overlapping with the third dam pattern 155.

Figure 12:
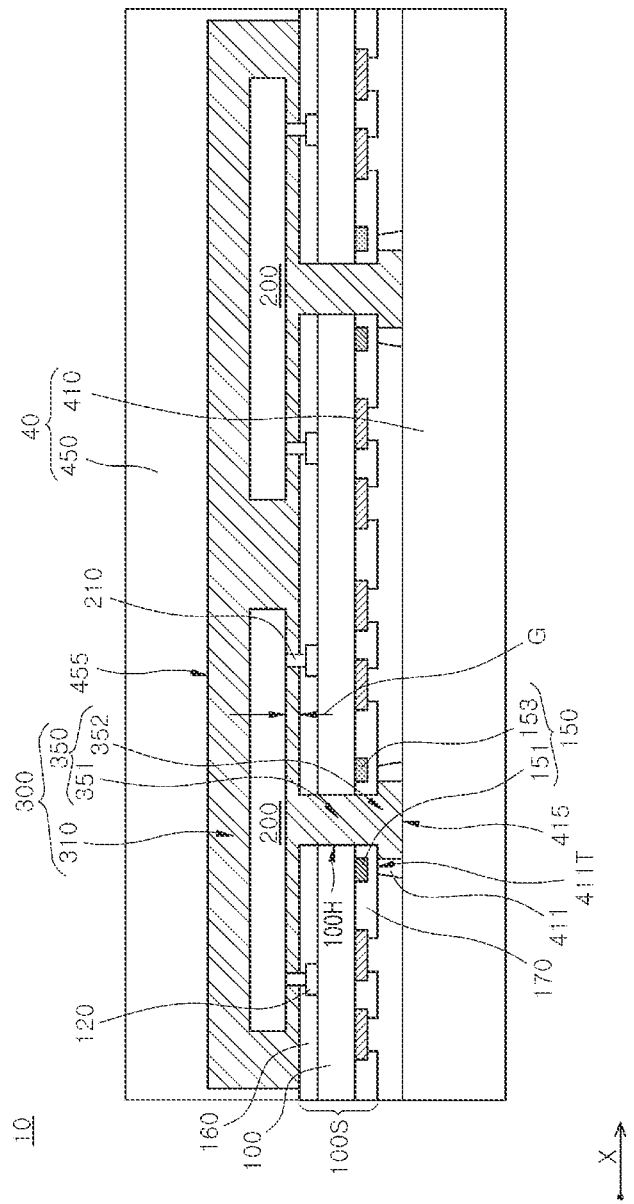
FIGS. 12 and 13 are schematic cross-sectional views illustrating a step of molding a molding layer in the method of manufacturing the semiconductor package of FIG. 7.
Figure 13:
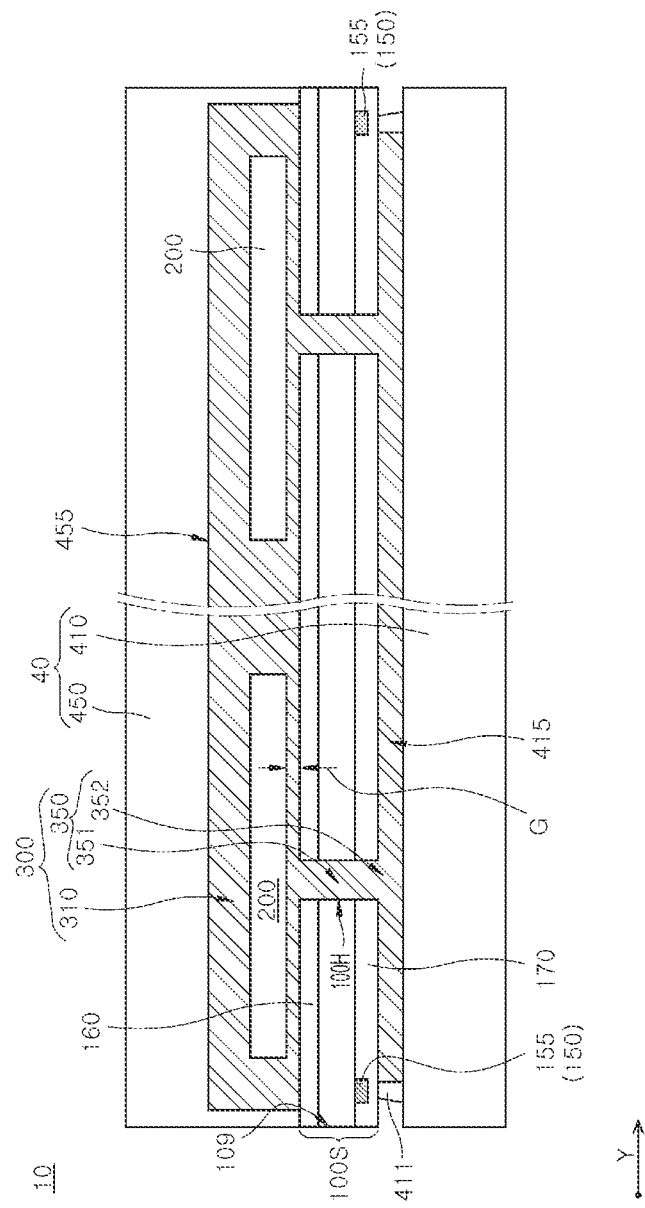

FIGS. 12 and 13 are schematic cross-sectional views illustrating a step S4 of molding a molding layer 300 in the method of manufacturing the semiconductor package of FIG. 7.

Referring to FIG. 7 along with FIGS. 12 and 13, the molding step S4 for forming the molding layer 300 may be performed. A molding material may be introduced into the upper cavity 455 of the upper mold 450. The molding material may be introduced to fill the upper cavity 455 and fill the gap G between each of the semiconductor chips 200 and the package substrate 100S. The molding material may be introduced into the lower cavity 415 through the vent holes 100H. The molding material may fill the upper cavity 455 to mold the upper mold 310. The molding material may fill the vent holes 100H to form the filling portions 351 of the lower molding portion 350, and the molding material may fill the lower cavity 415 to form the extended portions 352 of the lower molding portion 350. After molding the molding layer 300, the package substrate 100S may be separated from the mold chase 40.

Figure 14:
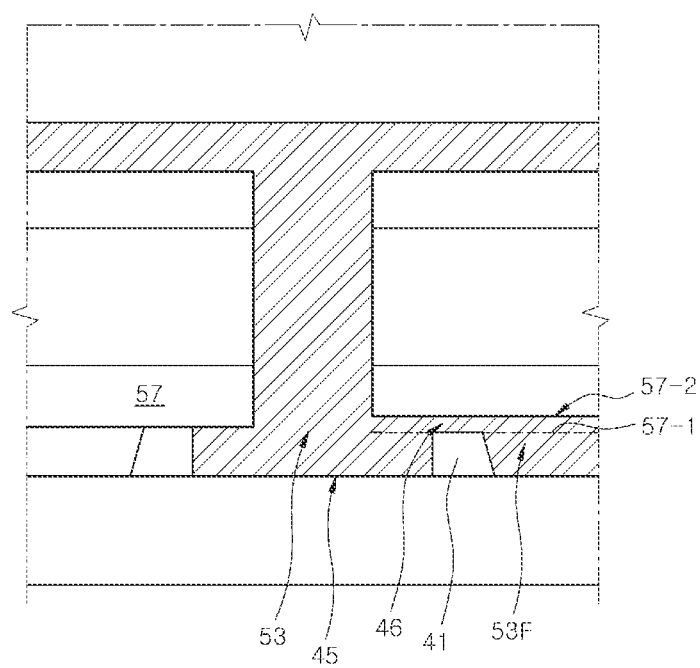
FIG. 14 is a schematic cross-sectional view illustrating a mold flash according to a comparative embodiment.
Figure 15:
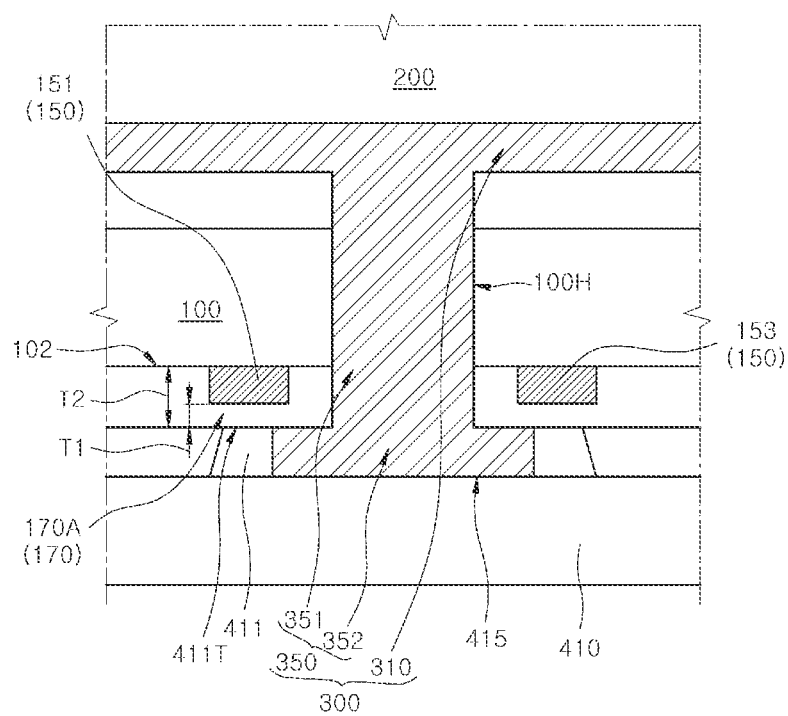
FIG. 15 is a schematic cross-sectional view illustrating an enlarged lower molding portion of the semiconductor package of FIG. 12.

FIG. 14 is a schematic cross-sectional view illustrating a mold flash 53F according to a comparative embodiment. FIG. 15 is a schematic cross-sectional view illustrating an enlarged portion of the lower mold 410 of FIG. 12. Referring to FIG. 14, in the comparative example in which the dam patterns (150 in FIG. 12) are not introduced, a lower cavity 45 may be closed by sides of lower mold 41 and a dielectric layer 57, and a molding process may be performed. As a molding material 53 flows into the lower cavity 45, stress due to the molding pressure may be concentrated on an interface between the sides of lower mold 41 and the dielectric layer 57. The dielectric material that forms the dielectric layer 57 is more susceptible to stress compared to a metallic material, and thus may be more easily deformed, compared to a metal layer, by the applied stress.

The dielectric layer 57 may be pressed by the stress according to the molding pressure, and a surface of the dielectric layer 57 may be retracted from an initial height 57-1 to a pressed height 57-2. Accordingly, an undesired gap clearance 46 may be caused between the dielectric layer 57 and the sides of lower mold 41. The molding material 53 may flow out of the gap clearance 46, thereby causing a defect in which the mold flash 53F is formed.

Referring to FIG. 15, in an embodiment, the lower cavity 415 are closed and encapsulated by the sides of lower mold 411, portions 170A of the second dielectric layer 170, overlapping with the sides of lower mold 411, and the dam patterns 150. As the molding material flows into the lower cavity 415 and the lower cavity 415 is encapsulated, stress due to the molding pressure may be applied to the elements. The overlap portions 170A of the second dielectric layer 170 and the upper ends 411T of the sides of lower mold 411 are in contact with each other, and the stress may be concentrated on interfaces between the overlap portions 170A of the second dielectric layer 170 and the upper ends 411T of the sides of lower mold 411.

Because the overlap portions 170A of the second dielectric layer 170 are supported by the dam patterns 150, the overlap portions 170A may resist the concentrated stress without being substantially deformed. In addition, because the overlap portions 170A of the second dielectric layer 170 overlap with the dam patterns 150, the thickness T1 of each of the overlap portions 170A may be thinner than the thickness T2 of another portion of the second dielectric layer 170 that is not supported by the dam pattern 150. In addition, a metal material, such as copper (Cu), constituting the dam pattern 150 may be a material relatively harder than a solder resist material, constituting the second dielectric layer 170. Accordingly, the dam patterns 150 may be more resistant than the second dielectric layer 170 without being deformed by stress.

The overlap structure of the overlap portions 170A of the second dielectric layer 170 and the dam patterns 150 makes it possible to resist the stress that is caused by molding pressure without being deformed. The overlap structure of the overlap portion 170A of the second dielectric layer 170 and the dam pattern 150 might not be substantially deformed by the stress. In the process of filling the lower cavity 415 with the molding material to mold, the lower cavity 415 may be maintained in a closed and encapsulated state by the overlap structure of the overlap portion 170A of the second dielectric layer 170 and the dam pattern 150. Accordingly, it is possible to substantially suppress, reduce, or prevent the occurrence of mold flash failure.

Figure 16:
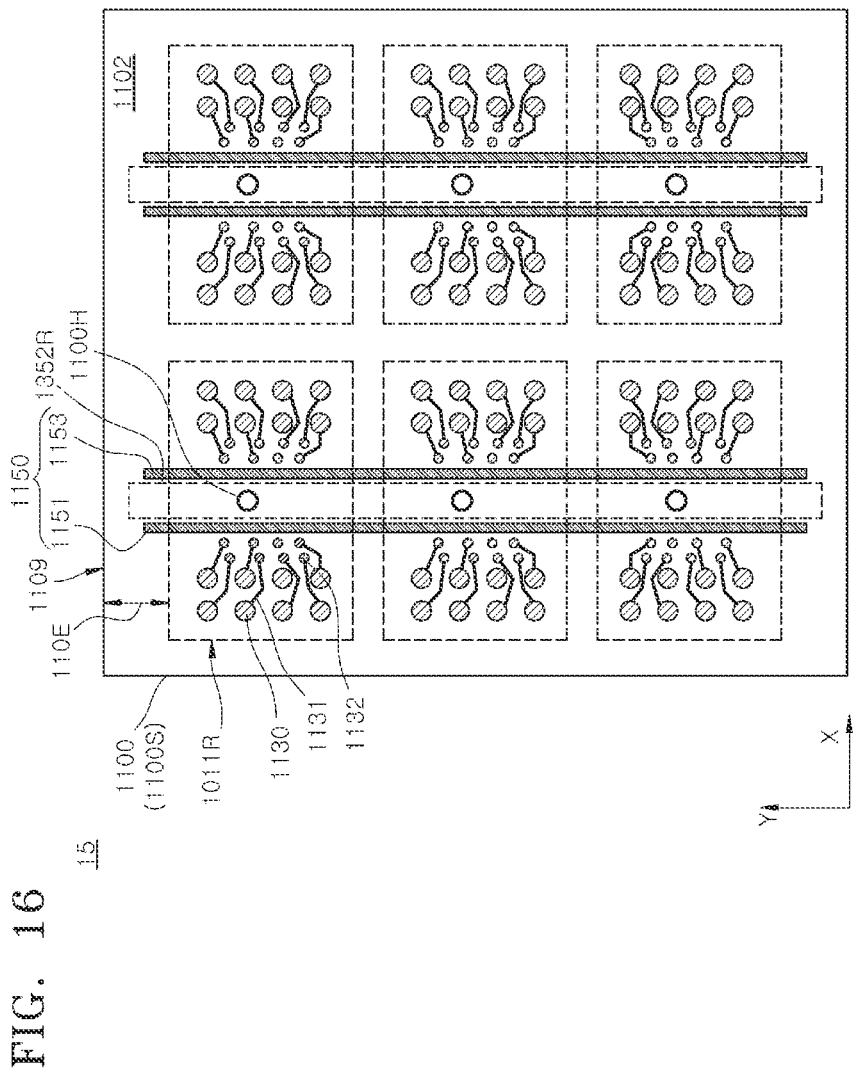
FIG. 16 is a schematic plan view illustrating a planar arrangement shape of dam patterns of a semiconductor package according to an embodiment of the present disclosure.

FIG. 16 is a schematic plan view illustrating a planar arrangement shape of dam patterns 1150 of a semiconductor package 19 according to an embodiment of the present disclosure.

Referring to FIG. 16, a package substrate 1100S of the semiconductor package 19 may include first dam patterns 1151 and second dam patterns 1153 on a substrate body 1100. The first dam patterns 1151 and the second dam patterns 1153 may be linear patterns that extend across unit regions 1011R. The first dam patterns 1151 and the second dam patterns 1153 may extend to edge regions 1100E of the substrate body 1100. Each of the dam patterns 1150 may include the first dam pattern 1151 and the second dam pattern 1153, and the third dam pattern (155 in FIG. 3) may be omitted. The first dam patterns 1151 and the second dam patterns 1153 may extend facing each other, and an extension region 1352R in which an extended portion of the lower molding portion is located may be set between the first dam patterns 1151 and the second dam patterns 1153. Vent holes 1100H may be arranged between the first dam patterns 1151 and the second dam patterns 1153. The first dam patterns 1151 and the second dam patterns 1153 may substantially reduce, prevent, or suppress contamination of ball lands 1130 by a mold flash.

Figure 17:
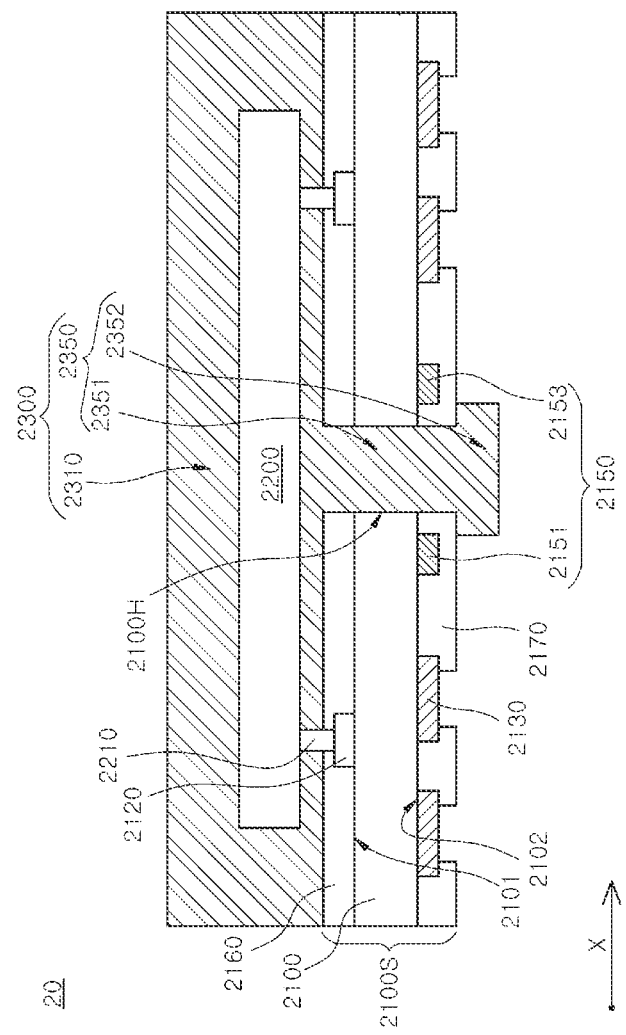
FIGS. 17 and 18 are schematic cross-sectional views illustrating a semiconductor package according to an embodiment of the present disclosure.
Figure 18:
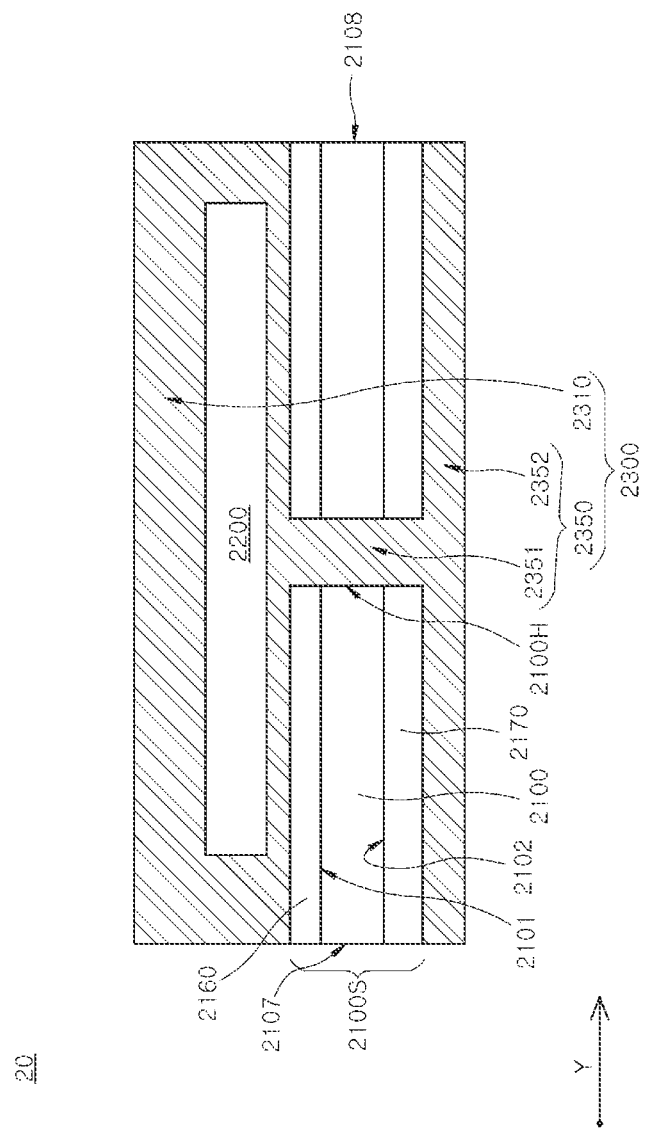
Figure 19:
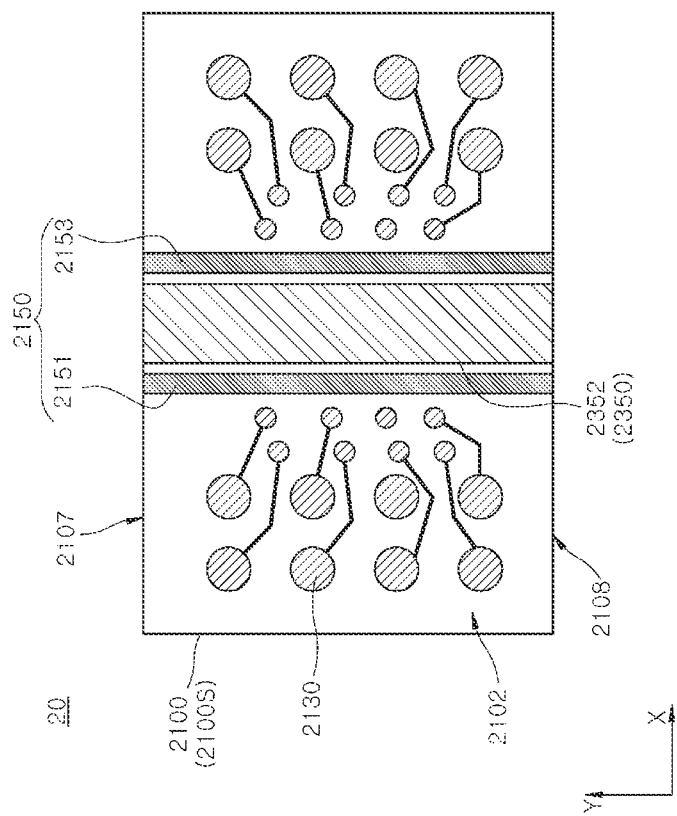
FIG. 19 is a schematic plan view illustrating a planar arrangement shape of dam patterns and an extended portion of a lower molding portion of the semiconductor package of FIG. 17.

FIGS. 17 and 18 are schematic cross-sectional views illustrating a semiconductor package 20 according to an embodiment of the present disclosure, and FIG. 19 is a schematic plan view illustrating a planar arrangement shape of a dam pattern 2150 and an extended portion 2352 of a lower molding portion of the semiconductor package 20 of FIG. 17.

Referring to FIGS. 17 and 18, the semiconductor package 20 may include a package substrate 2100S, a semiconductor chip 2200, and a molding layer 2300. The semiconductor chip 2200 may be electrically and physically connected to the package substrate 2100S through inner connectors 2210. The package substrate 2100S may include a vent hole 2100H therethrough. The molding layer 2300 may be disposed in a structure with an upper molding portion 2310 and a lower molding portion 2350. The lower molding portion 2350 may be connected to the upper molding portion 2310 through the vent hole 2100H. The upper molding portion 2310 may encapsulate the semiconductor chip 2200. The lower molding portion 2350 may include a filling portion 2351 that fills the vent hole 2100H and an extended portion 2352 that is positioned under the package substrate 2100S.

The package substrate 2100S may include a substrate body 2100, a first dielectric layer 2160, and a second dielectric layer 2170 that is disposed on the substrate body 2100. The substrate body 2100 may have a first surface 2101 and a second surface 2102 that are on opposite sides of each other. Ball lands 2130 and dam patterns 2150 may be disposed under the second surface 2102 of the substrate body 2100. Each of the dam patterns 2150 may include a first dam pattern 2151 and a second dam pattern 2153 that face each other.

Referring to FIG. 19, the ball lands 2130 may be disposed on the second surface 2102 of the substrate body 2100 of the package substrate 2100S, and the first and second dam patterns 2151 and 2153 may be disposed to be spaced apart from the ball lands 2130.

The substrate body 2100 may include a first edge 2107 and a second edge 2108, each being opposite of each other. The second surface 2102 may be disposed to connect the first edge 2107 and the second edge 2108 of the substrate body 2100. The first and second dam patterns 2151 and 2153 may be linear patterns that extend to the first edge 2107 and the second edge 2108 across the second surface 2102. The extended portion 2352 of the lower molding portion may extend to partially overlap with portions between the first and second dam patterns 2151 and 2153 of the substrate body 2100. The extended portion 2352 of the lower molding portion may have a shape that extends to the first edge 2107 and the second edge 2108 across the second surface 2102 of the substrate body 2100.

The extended portion 2352 of the lower molding portion and the first and second dam patterns 2151 and 2153 may additionally serve to reinforce the semiconductor package 20. Because the extended portion 2352 of the lower molding portion and the first and second dam patterns 2151 and 2153 extend to the first edge 2107 and the second edge 2108 across the second surface 2102 of the substrate body 2100, the extended portion 2352 of the lower molding portion and the first and second dam patterns 2151 and 2153 may serve to reinforce the semiconductor package along the Y-axis direction. Accordingly, when an undesired external force is applied to the semiconductor package 20, a bending phenomenon of the semiconductor package 20 may be substantially reduced, suppressed, or prevented.

The upper molding portion 2310 and the package substrate 2100S may have thermal expansion coefficients that are different from each other. Due to the difference in thermal expansion coefficients of the upper molding portion 2310 and the package substrate 2100S, stress that warps the semiconductor package 20 according to temperature changes may be generated. The extended portion 2352 of the lower molding portion and the first and second dam patterns 2151 and 2153 may serve to relieve or compensate for such stress, or to reinforce the semiconductor package 20 so that the semiconductor package 20 resists such stress.

According to the embodiments of the present disclosure as described above, the dam patterns may be introduced into the package substrate and act as elements to improve mold leakage. The dam patterns may improve the contact state of the mold and the package substrate, thereby improving a phenomenon in which a molding material leaks from a mold cavity or a phenomenon in which a mold flash is caused.

Figure 20:
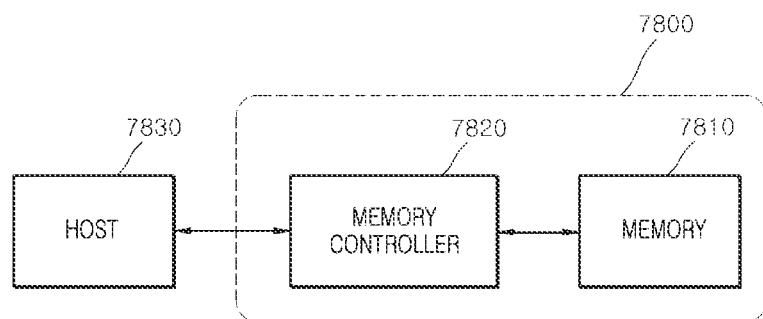
FIG. 20 is a block diagram illustrating an electronic system employing a memory card including a package according to an embodiment of the present disclosure.

FIG. 20 is a block diagram illustrating an electronic system including a memory card 7800 employing at least one of the semiconductor packages according to the embodiments. The memory card 7800 may include a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 21:
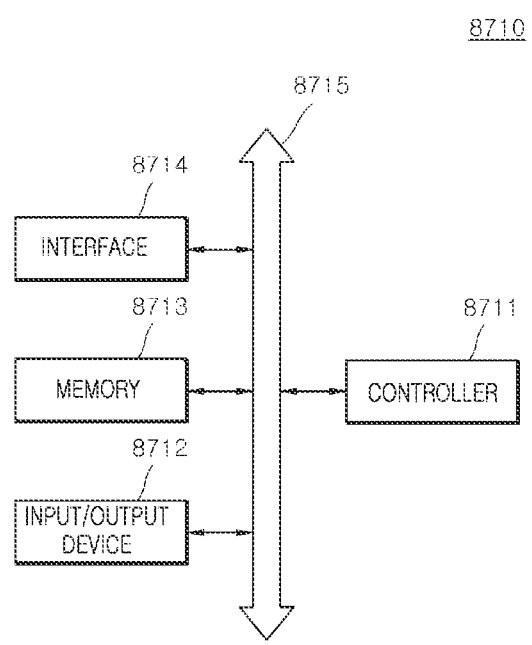
FIG. 21 is a block diagram illustrating an electronic system including a package according to an embodiment of the present disclosure.

FIG. 21 is a block diagram illustrating an electronic system 8710 including at least one of the semiconductor packages according to the embodiments. The electronic system 8710 may include a controller 8711, an input/output device 8712, and a memory 8713. The controller 8711, the input/output device 8712, and the memory 8713 may be coupled with one another through a bus 8715 that provides a path through which data move.

In an embodiment, the controller 8711 may include one or more microprocessor, digital signal processor, microcontroller, and/or logic device that is capable of performing the same functions as these components. The controller 8711 or the memory 8713 may include at least one of the semiconductor packages according to the embodiments of the present disclosure. The input/output device 8712 may include at least one selected among a keypad, a keyboard, a display device, a touchscreen and so forth. The memory 8713 may be a device for storing data. The memory 8713 may store data and/or commands to be executed by the controller 8711, and the like.

The memory 8713 may include a volatile memory device, such as a DRAM and/or a nonvolatile memory device such as a flash memory. For example, a flash memory may be mounted to an information processing system, such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

The inventive concept has been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the inventive concept is not limited to the above descriptions but defined by the accompanying claims, and all of distinctive features in the equivalent scope should be construed as being included in the inventive concept.

What is claimed is:

1. A semiconductor package comprising:
a package substrate with a vent hole formed therethrough;
a semiconductor chip disposed on the package substrate; and
a molding layer including an upper molding portion that encapsulates the semiconductor chip, and a lower molding portion that is connected to the upper molding portion through the vent hole,
wherein the package substrate includes:
a substrate body with the vent hole;
ball lands disposed on the substrate body and spaced apart from the vent hole;
first and second dam patterns extending across the substrate body between the vent hole and the ball lands and further extending into the edge regions of the substrate body, and
a dielectric layer that extends to cover the substrate body, the first and second dam patterns being covered and some portions of the ball lands being opened by the dielectric layer.

2. The semiconductor package of claim 1, wherein the lower molding portion extends to fill a space between the first and second dam patterns and further extends into the edge regions of the substrate body.

3. The semiconductor package of claim 1, wherein the vent hole is disposed between the first and second dam patterns.

4. The semiconductor package of claim 1, wherein the first and second dam patterns include linear patterns that extend while facing each other.

5. The semiconductor package of claim 1, wherein the dielectric layer includes a solder resist material.

6. The semiconductor package of claim 1, wherein the first and second dam patterns and the ball lands include substantially the same metal material.

7. The semiconductor package of claim 6, wherein the first and second dam patterns and the ball lands include copper (Cu).

8. The semiconductor package of claim 1,
wherein the substrate body includes first and second surfaces that are on opposite sides of each other,
wherein the semiconductor chip is disposed on the first surface, and
wherein the ball lands and the first and second dam patterns are disposed under the second surface.

9. The semiconductor package of claim 1, wherein the vent hole overlaps with the semiconductor chip.

10. A semiconductor package comprising:
a package substrate with a vent hole formed therethrough;
a semiconductor chip disposed on the package substrate; and
a molding layer including an upper molding portion that encapsulates the semiconductor chip, and a lower molding portion that is connected to the upper molding portion through the vent hole,
wherein the package substrate includes:
a substrate body including first and second edges that are on opposite sides of each other and a surface between the first and second edges;
ball lands disposed on the surface of the substrate body;
first and second dam patterns spaced apart from the ball lands, extending to the first and second edges across the surface, and
a dielectric layer that extends to cover the substrate body, the first and second dam patterns being covered and some portions of the ball lands being opened by the dielectric layer.

11. The semiconductor package of claim 10, wherein the lower molding portion extends to the first and second edges across the surface of the substrate body to fill a space between the first and second dam patterns.

12. The semiconductor package of claim 11, wherein the vent hole is disposed between the first and second dam patterns.

13. The semiconductor package of claim 11, wherein the first and second dam patterns include linear patterns that extend to face each other.

14. The semiconductor package of claim 11, wherein the first and second dam patterns and the ball lands include substantially the same metal material.

15. The semiconductor package of claim 14, wherein the first and second dam patterns and the ball lands include copper (Cu).

16. The semiconductor package of claim 11, wherein the vent hole overlaps with the semiconductor chip.

17. A semiconductor package comprising:
a package substrate with a vent hole formed therethrough;
a semiconductor chip disposed on the package substrate;
wherein the package substrate includes:
a substrate body with the vent hole disposed therethrough;
first and second dam patterns extending across the substrate body and further extending into edge regions of the substrate body;
a dielectric layer covering the first and second dam patterns; and
a lower mold formed on the dielectric layer to be aligned with the first and second dam patterns,
wherein the first and second dam patterns are formed of a harder material than the dielectric layer.

* * * * *